United States Patent [19]

Hetzel et al.

[11] Patent Number: 5,266,037

[45] Date of Patent: Nov. 30, 1993

[54] GULL WING IC CARRIER/SOCKET SYSTEM

[75] Inventors: Kurt C. Hetzel; Patrick H. Harper, both of Phoenix, Ariz.

[73] Assignee: Precision Connector Designs, Inc., Peabody, Mass.

[21] Appl. No.: 882,808

[22] Filed: May 14, 1992

[51] Int. Cl.5 ............................................. H01R 9/09
[52] U.S. Cl. ...................................... 439/72; 439/331; 439/83
[58] Field of Search .................... 439/70, 71, 72, 73, 439/83, 330, 331, 525, 526, 876

[56] References Cited

U.S. PATENT DOCUMENTS

| | | | |
|---|---|---|---|
| 3,409,861 | 11/1968 | Barnes et al. | 439/526 X |
| 4,758,176 | 7/1988 | Abe et al. | 439/331 |
| 4,872,845 | 10/1989 | Korsunsky et al. | 439/330 X |
| 4,918,513 | 4/1990 | Kurose et al. | 439/71 X |
| 5,026,303 | 6/1991 | Matsuoka et al. | 439/526 |
| 5,088,930 | 2/1992 | Murphy | 439/70 |

FOREIGN PATENT DOCUMENTS 0126582  5/1990  Japan .................... 439/330

Primary Examiner—Larry I. Schwartz
Assistant Examiner—Khiem Nguyen
Attorney, Agent, or Firm—Edwin H. Paul; Jerry Cohen

[57] ABSTRACT

A system for protecting a gull-wing IC providing a carrier (5) that mates to a programming socket (21) and to a development socket (40). The IC need not be removed from carrier throughout the handling, test/burn-in, programming, and final assembly on the PC board. Moreover, the footprint of the output electrical contacts on the development socket match the footprint of the IC leads, so that the etched PC board pads will accept the IC leads or the development socket output contacts, wherein the assembler may mount the IC using the carrier and the SMT socket or not.

1 Claim, 3 Drawing Sheets

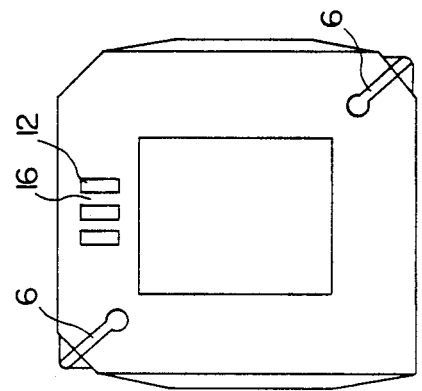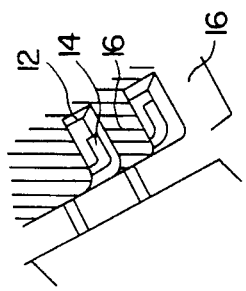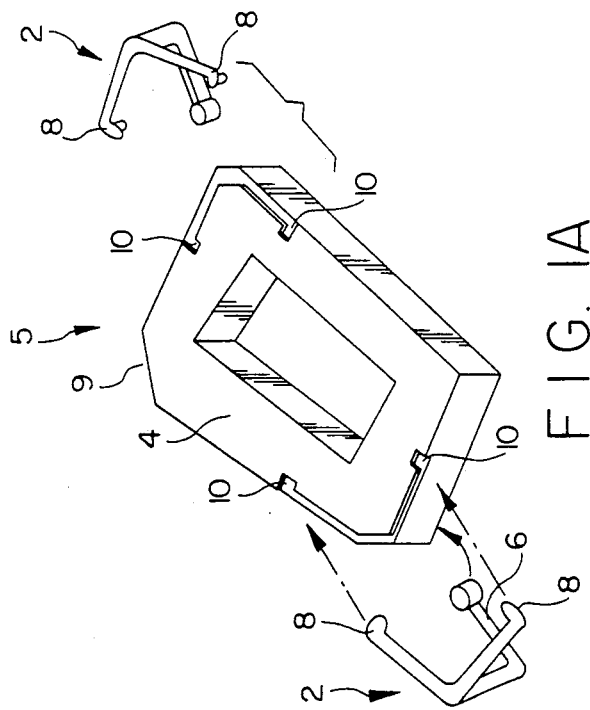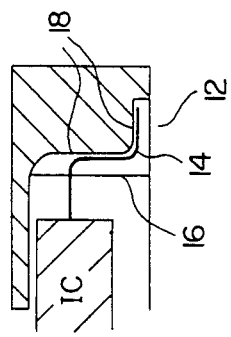

GULL WING IC CARRIER/SOCKET SYSTEM

FIELD OF THE INVENTION

The present invention relates generally to integrated circuit (IC) carriers and mating sockets for gull-wing leaded integrated circuits. The present invention has particular application for: a carrier for a gull-wing IC, that mechanically and electrically protects the IC package and leads; a mating surface-mount (SMT) socket soldered to a printed circuit board (PCB) allowing the IC to be removably mounted to the board; and a mating test/burn-in and programming socket.

BACKGROUND OF THE INVENTION

One form of integrated circuit package, called gull-wing because of the shape of the leads, is a popular surface mount design that is easy to solder and inspect. But since the leads are thin and extend away from the body of the package the leads are easily bent or broken. It is important to protect these leads especially for expensive large scale integration (LSI) chips. LSI is herein used as a generally descriptive term for any of the larger packages with large ICs, multiple hybrid ICs, or any other composite type construction. LSI is not limited to a narrow definition.

IC manufacturers routinely package these ICs in trays or carriers that protect the IC pack from static charge and physical harm during routine handling and shipping. It is important to protect the fragile leads. These trays often provide guides that substantially enclose the leads. Such guides prevent the test/burn-in or other use of the ICs while still packaged.

IC end users and test houses prefer, to reduce handling of the chip (herein defined as the packaged IC), to use the trays in which the chips are shipped. ICs often go through a series of handling operations that are a source of failure for such ICs; the ICs are: removed from the shipping carriers, placed in programming/test-/burn-in fixtures, programmed/tested, repackaged for stocking or subsequent shipping, and then placed in another socket/fixture or soldered to a PCB for use. This handling (or mishandling) is a source of harm to the ICs.

Sockets are routinely used on PC boards to allow the IC to be changed or interconnections modified as the circuitry and programming are being debugged or upgraded. But in production, sockets are a source of failure, usually due to mechanical problems of alignment, unreliable electrical contacts and sometimes added capacitance and inductance associated with the socket itself. In addition there is an added cost of the socket. Sockets are often bulky with high profiles obviating their use in closely stacked board assemblies. These negatives are balanced by the ability of replacing or reprogramming the chip without damaging the PC board. This is important since LSI chips and completed PC boards are expensive, and replacing a soldered on chip without damaging the board or the replacement chip is a skill that is not routinely done nor recommended in production or even in development environments.

An object of this invention is to provide an IC carrier/socket system wherein the IC package and its gull wing leads are protected during routine inspection, test/burn-in, programming, reprogramming and use.

It is a another object to provide an IC carrier/socket system wherein the IC is placed in the protective carrier that may be placed in a programming/test/burn-in socket for programming/test/burn-in of the IC, and then the carrier (and IC) may be placed in an SMT socket soldered onto a PC board for system debugging.

It is a further object to provide a carrier/socket system wherein the SMT socket may be used on production PC boards thereby allowing field replacement.

Another object of this invention is to provide an SMT/production socket with a contact layout footprint that matches the gull-wing pad footprint of the IC.

It is another object of this invention to provide a carrier/socket system wherein the carrier/socket has minimum impact on the electrical performance of the IC.

SUMMARY OF THE INVENTION

The foregoing objects are met with a new system comprising an IC carrier, a mating SMT socket, and a mating test socket. The IC is placed into the carrier and secured by clips. The carrier provides a recessed channel for each gull-wing lead with separators between each lead. But, one side of the channel is open for making electrical connections to the IC leads.

The mating SMT socket is low profile that removably accepts the carrier (and IC). This socket has electrical spring contacts that extend into the carrier to make electrical contacts. These electrical contacts make scrubbing action connections with the IC leads just as in the test socket. But the bottom of each of these electrical spring contacts is formed into a solderable pad directly under each IC lead, and, preferably, the pad solder area matches the gull-wing solder area. The result is that the SMT socket can be used to advantage to debug a PC board, and the PC etched layout need not be changed to solder the IC directly onto the production board, if desired. With this flexible system, the SMT IC socket can be used or not used on any PC board as the manufacturer determines. The SMT socket is constructed and arranged with no separators or slots or other impediments between or around the contacts such all soldered joints of the contact terminations to the receiving pads on the PC board are viewable and accessible.

Another benefit is that the SMT socket low profile allows close stacking of PCBs. Also, the electrical contacts are short, thin and bowed to form spring conductive prongs, or pins. These pins, in a preferred embodiment, are about ¼ inch long to minimize added inductance, the leads are thin to minimize effective face-to-face area of the pins, whereby the pin to pin capacitance and resulting crosstalk effects are minimized.

The mating test socket is designed to accept and hold the carrier, but also to easily release it. The test socket provides a uniform force holding of the carrier (and IC) in the test socket, and electrical spring contacts extend into the carrier channels to make connections to the IC leads, and the top has an opening such that a testing result dot may be placed on the chip, e.g., red=bad, blue dot=good. The carrier design provides a recessed channel that accepts an IC lead wherein each IC lead is retained by three side walls, and the spring contact from the test socket makes contact via the open side. The spring contact drives the lead against the lead supporting retaining walls with a scrubbing (wiping) action that ensures a reliable electrical contact on the vertical part of the gull-wing lead. The flat part of the lead which is meant for soldering to the PCB is left undisturbed preventing any damage to the lead so as to not affect solderability.

A floating, pivoted mechanism provides a uniform force to retain the carrier within the test socket for test/burn-in or programming of the IC, and, preferably, the test socket is permanently mounted to the test fixture by pins soldered through the PCB plated through holes, although many other known methods may be used.

A benefit of this invention is that the IC may be mounted in the protective carrier and remain so protected from the time of shipment by the IC manufacturer to the final assembly on the finished PC board. The IC is protected by the carrier during routine handling, programming, test/burn-in, reprogramming and final use on a PC board. Also, the carrier is preferably made of anti-static material; the carrier is low profile fitting into chip carrying trays and tubes; and the carrier accommodates all packages, e.g., ceramic, plastic.

Other objects, features and advantages will be apparent from the following detailed description of preferred embodiments thereof taken in conjunction with the accompanying drawing in which:

BRIEF DESCRIPTION OF THE DRAWINGS

FIG. 1A is a top isometric view of the carrier,

FIG. 1B is a bottom view of the carrier,

FIG. 1C is a detailed of the IC lead mounted in the carrier,

FIG. 1D is a side view of the IC lead mounted in the carrier,

DETAILED DESCRIPTION OF PREFERRED EMBODIMENTS

Figure 2B:
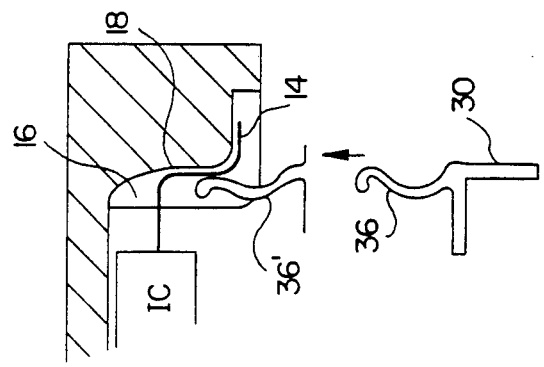
FIG. 2B is a sectioned side view on the contact area.

FIG. 1A shows an isometric view of the IC carrier from the top. The spring clips 2 are separate pieces inserted on two opposing corners of the carrier. In use the clips are permanently inserted into the carrier by matingly inserting the end structures 8 into the matching grooves 10 that are formed in the carrier. To insert an IC into the carrier the carrier is inverted, the spring clips extensions 6 are deflected out of the way and the IC is placed (dropped) into the carrier until the IC abuts the the carrier top shelf 4. Each spring clip extension 6 returns to its unflexed position wherein the extension angles underneath toward the center of the IC providing a spring force holding the IC in the carrier. Alternatively the IC maybe held in the carrier by designing the carrier with a close interference mounting location where the IC is pressed or snapped into the carrier. The carrier has a polarizing flat 9 on one corner to prevent improper loading of the carrier into the mating sockets described below, and there is enough top surface area to permit marking of the IC for identification.

FIG. 1B, a bottom view of the carrier, shows the extensions 6 of the clips angling toward the center. Channels 12 formed in the plastic carrier of this preferred embodiment accept the gull-wing leads of the IC. When installed each gull-wing lead is bound by a mating channel on three sides with the bottom open. But the bottom open side is recessed into carrier and the webbing 16 of plastic between each lead extends beyond each lead providing protection for each lead.

FIG. 1C, an isometric view, more clearly shows the gull-wing lead 14 nestled into the mating channel 12 separated by the web 16. Each lead 14 is inset into the channel 12 with the web 16 extending beyond the lead thereby protecting the lead.

FIG. 1D is a side section side view of the mating of the lead 14 in the channel. The recessed floor 18 of the channel abuts the lead 14 providing support. When installed in the carrier a finger wiping across the bottom of the carrier will not touch an IC lead.

Figure 2A:
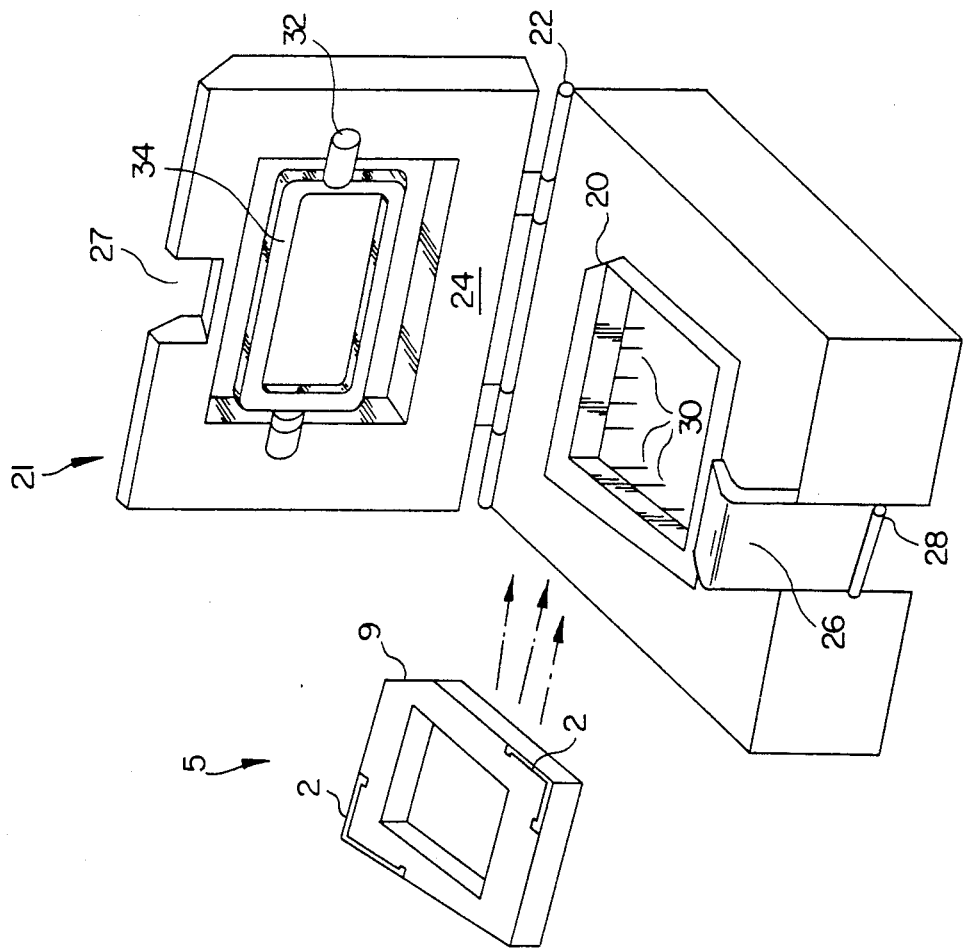
FIG. 2A is an isometric view of the test/burn-in socket.

FIG. 2A is an isometric top view of a mating test socket 21 that accepts the carrier 5. The carrier mounts in the middle where the polarizing flat 9 on the carrier mates with the flat 20 on the programming socket to ensure proper orientation of the carrier to the socket. A hinged 22 top 24 closes on top of the IC securing the IC. A spring 28 loaded hinged latch 26 engages the top at a coordinating structure 27 to maintain the top closed. In other preferred embodiments other commonly found structures to maintain the top closed may be used, e.g., Velcro, nut and bolt, slide latch, etc.

In this preferred embodiment the top 24 is open the middle with a pivoted 32 rod-like frame structure 34 that contacts and maintains equal pressure on the IC.

FIG. 2B is a side section detail of the test socket showing IC lead 14 seated in the channel with the recessed floor 18 and the web 16 (there is a front web 16 not shown). The lead is accessible from below. The bowed pins 36 are arranged to matingly extend into each channel 12 in the carrier, and so to make electrical connections to each gull-wing lead. The arrangement provides a scrubbing electrical connection on the heel/-vertical portion of the gull-wing lead, where the bowed pin 36 flexes 36' with the gull-wing lead against the channel wall 18. The electrical connection is designed to leave the flat part of the lead (where soldering would occur) untouched preventing any damage to the lead. When mounted the IC may be programmed or reprogrammed, tested or "burned-in" (operation of the IC under power or temperature or both to weed out infant mortality ICs). Other terminations such as surface mount, cable connections or individual wire connections may be used in other preferred embodiments.

The bowed pin 36 extends through the bottom of the test socket and terminates with a pin 30 suitable for soldering to plated through holes of a PC board. The bow in these pins is enough to ensure good electrical contact, but these pins are short and slightly bowed to reduce inductance and resistance of the socket and so reduce electronic problems and anomalies associated with high speed operation of the IC within the carrier and programming socket system.

Figure 3C:
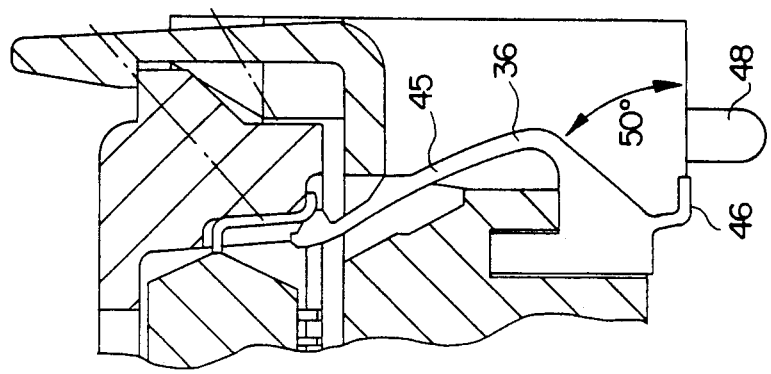
FIG. 3C is a sectioned side view of the IC lead and contacting pin.
Figure 3A:
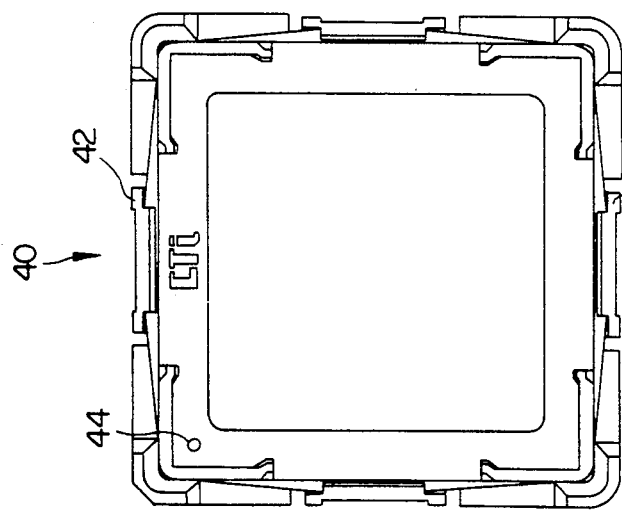
FIG. 3A is a top view of the SMT socket.
Figure 3B:
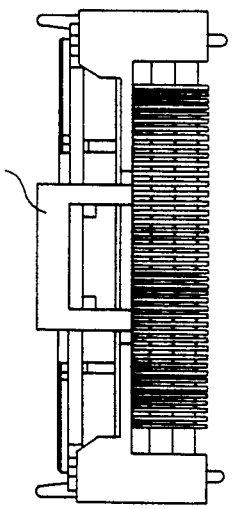
FIG. 3B is a side view of the SMT socket.

FIG. 3A is a top view and FIG. 3B a side section view of the SMT socket 40. The carrier mounts from above fitting down into the socket. The development socket has a polarizing flat 42 to mate with the flat 9 on the carrier prevent improper mounting, as described before, and there is an indicator 44 designating pin 1 on the IC package. FIG. 3B shows the side vertical snap extensions 42 of the SMT socket that bend laterally, as the carrier is mounted, and then snap back over part of the carrier latching the carrier to the socket.

FIG. 3C has a section showing an electrical contact bowed pin 45, similar to the bowed pin 36 previously described at the electrical contact portion, but the opposite end of this pin 45 terminates in a flat pad 46 suitable for surface mount soldering to a PC board. Moreover, the relative positioning and size of the these pads 46 allows them to be soldered to the etched printed circuit pads of the PC board designed to mate with the IC gull-wing leads. This preferred embodiment allows the assembled PC board manufacturer to use the development socket or not without changing the PC board layout or etch. To ease proper mounting to the PC board guide pins 48 are used to engage corresponding holes in the board.

The material used to fabricate the carrier and the sockets may be of any of the commonly used material known in the industry, e.g., polysulfone, polyarylsulfone, polyethersulfone, and the electrical contact material used in the sockets may be any of those commonly used in the industry, e.g., beryllium copper, phosphor bronze.

It will now be apparent to those skilled in the art that other embodiments, improvements, details and uses can be made consistent with the letter and spirit of the foregoing disclosure and within the scope of this patent, which is limited only by the following claims, construed in accordance with the patent law, including the doctrine of equivalents.

What is claimed is:

1. A system for handling and protecting a gull-wing leaded IC device comprising:

(a) carrier means having a top surface, an underside and grooves is designed and constructed wherein a gull-wing IC having leads is secured within the carrier means, (b) means defining a mating surface mount socket wherein the carrier may be removably mounted into said surface mount socket, and (c) means for making electrical connections in said surface mount socket to each said IC gull-wing leads, wherein each said electrical connection means terminates in a contact suitable for soldering onto receiving pads on a PC board forming a plurality of soldered contact termination joints, and wherein the pattern of the contacts corresponds directly to the pattern of the IC gull-wing leads, so that either the socket or the IC may be soldered to the receiving pads, wherein said surface mount socket is constructed and arranged with no separators or slots or other impediments between or around said contacts such that each of said soldered contact termination joints to said receiving pads is viewable and accessible, (d) means defining a mating test/programming socket which can removably accommodate said carrier means, (e) means defining a floating, hinged structure wherein said hinged structure conforms with the carrier top surface thereby distributing the force on the carrier substantially evenly, (f) means for making electrical connections in said test socket to each said IC gull-wing leads, and (g) removable clip means which extend on the underside of the IC for securing the IC within the carrier means, said clip means having extensions which mate with grooves on the carrier means.

* * * * *